United States Patent [19]
Sparks

[11] Patent Number: 6,100,828
[45] Date of Patent: Aug. 8, 2000

[54] ANALOG-TO-DIGITAL CONVERTER TEST SYSTEM AND METHOD

[75] Inventor: David A. Sparks, Double Oak, Tex.

[73] Assignee: Texas Instruments Incorporated, Dallas, Tex.

[21] Appl. No.: 09/207,556

[22] Filed: Dec. 8, 1998

Related U.S. Application Data

[60] Provisional application No. 60/069,689, Dec. 12, 1997.

[51] Int. Cl.[7] .................................................. H03M 1/10
[52] U.S. Cl. ............................................................ 341/120
[58] Field of Search ............................................. 341/120

[56] References Cited

U.S. PATENT DOCUMENTS 5,909,186  6/1999  Gohringer ................................ 341/120

*Primary Examiner*—Trong Phan
*Attorney, Agent, or Firm*—Alan K. Stewart; Wade James Brady, III; Frederick J. Telecky, Jr.

[57] ABSTRACT

An analog-to-digital converter test system and method 10 is provided that comprises a digital-to-analog converter system 26. An analog-to-digital converter system 32 is tested using an internal analog input signal 30 generated by the digital-to-analog converter system 26. The digital-to-analog converter system 26 generates the internal analog input signal 30 from an internal digital input signal 24 generated by a programmable data ramp controller 14. The programmable data ramp controller 14 produces a high precision internal digital input signal 24 with predetermined start and stop voltage values 16 repeated over a fixed frequency determined by a programmable divide circuit 18.

14 Claims, 1 Drawing Sheet

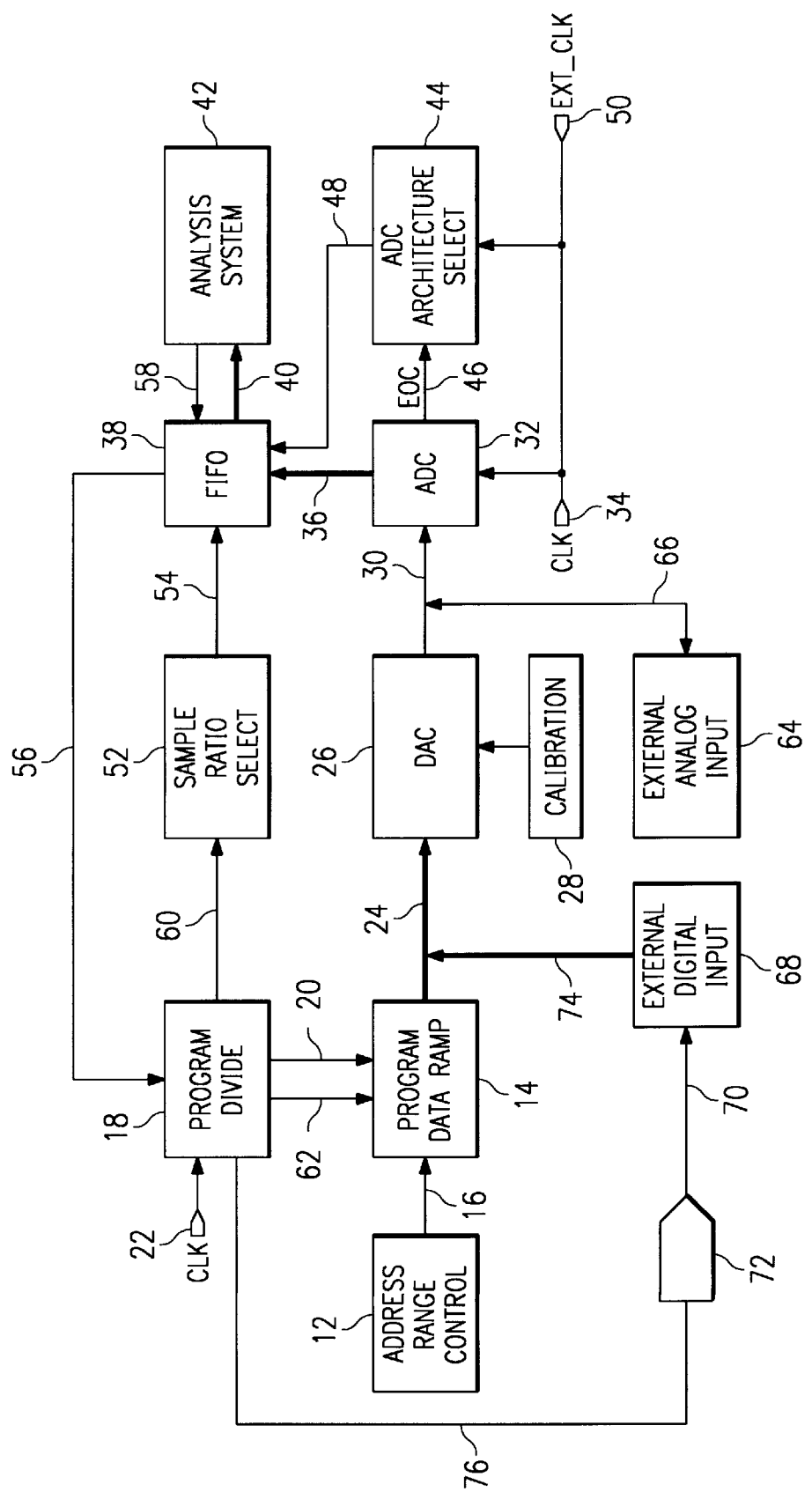

6,100,828

ANALOG-TO-DIGITAL CONVERTER TEST SYSTEM AND METHOD

This application claims priority under 35 USC § 119 (e)(1) of provisional application Ser. No. 60/069,689, filed Dec. 12, 1997.

TECHNICAL FIELD OF THE INVENTION

This invention relates in general to the field of electronic systems and more particularly, to an improved analog-to-digital converter test system and method.

BACKGROUND OF THE INVENTION

Analog-to-digital converter systems receive analog signals and convert them to a digital representation of the signal so that the signals can be processed in the digital domain. Analog-to-digital converter systems are very popular and may be used to convert voice, music, or any other signal consisting of a constantly varying character into digital representations so that the digital signals can be analyzed, processed, transferred or manipulated in the digital domain. Converted analog signals can then be digitally stored in computer systems, transferred via modems, or manipulated with various software systems. The digital signals can later be converted back to an analog signal for various uses.

Analog-to-digital converter systems are difficult to design and, thus, testing the analog-to-digital converter systems during design is important. Imprecision in the analog-to-digital conversion will ultimately result in poor digital representation of the analog signal and subsequent poor analog representation of the digital signal when the digital signal is converted back to an analog signal.

Testing analog-to-digital converter systems is also expensive, time consuming, and requires complex testing techniques using extensive support hardware. Also, existing analog-to-digital converter test systems are very inflexible regarding parameters such as signal sources, signal frequency, and signal precision.

Analog-to-digital converter test systems need constant signal testing and testing using more complex signals. Input signals must be precise in order to be used as references. Also, output analyzers of the converted analog signal vary widely in capability and capacity.

SUMMARY OF THE INVENTION

Accordingly, a need has arisen for an analog-to-digital converter test system and method that provides both linearity and dynamic testing of an analog-to-digital converter system with little external support hardware.

In accordance with the teachings of the present invention, an analog-to-digital converter test system and method are provided that substantially eliminate and reduce disadvantages and problems associated with prior art systems and methods. According to one embodiment of the present invention, a testing system is provided that comprises an address range control circuit to input start and stop voltage values of a digital ramp signal to a programmable data ramp controller. A programmable divide circuit controls the frequency of a digital voltage ramp created by the programmable data ramp controller. The programmable data ramp controller then transmits a digital voltage ramp signal to a digital-to-analog converter system to create a precise analog signal. Using this signal, an analog-to-digital converter system can be tested and analyzed for high resolution conversions.

BRIEF DESCRIPTION OF THE DRAWINGS

A more complete understanding of the advantages of the present invention may be acquired by referring to the accompanying FIGURES wherein:

FIG. 1 is a schematic block diagram of a testing system constructed according to the teachings of the present invention.

DETAILED DESCRIPTION OF INVENTION

FIG. 1 illustrates an analog-to-digital converter testing system, indicated generally at 10, which comprises an address range control circuit 12 connected to a programmable data ramp controller 14. The address range control circuit 12 assigns the binary values of a starting voltage and a stopping voltage of a digital voltage ramp. The address range control circuit 12 then transmits these start and stop values 16 to the programmable data ramp controller 14. A suitable programmable data ramp controller is manufactured by Texas Instruments under part number 74F163.

Also connected to the programmable data ramp controller 14 is a programmable divide circuit 18. The programmable divide circuit 18 controls the frequency at which the voltage ramp increments by sending a divided clock signal 20 to the programmable data ramp controller 14. The programmable divide circuit 18 obtains the desired divided clock signal 20 by dividing the frequency of an on-board clock 22 by a desired value. A suitable programmable divide circuit is manufactured by Texas Instruments under part number 74HC4040. Thus, the level and speed of the digital voltage ramp created by the programmable data ramp controller 14 is a function of the start and stop values 16 received from the address range control circuit 12 and the divided clock signal 20 received from the programmable divide circuit 18.

The programmable data ramp controller 14 then transmits the digital voltage ramp in the form of an internal digital input signal 24 to a digital-to-analog converter system 26. The digital-to-analog converter system 26 converts the internal digital input signal 24 to an analog output voltage having a magnitude that is a function of the digital input. A suitable digital-to-analog converter system is manufactured by Analog Devices under part number AB1139. A calibration system 28 may also be connected to the digital-to-analog converter system 26 to calibrate the digital-to-analog converter system 26. The digital-to-analog converter system 26 is able to provide a precise internal analog input signal 30 created from a high resolution and linear digital voltage ramp.

The internal analog input signal 30 is transmitted from the digital-to-analog converter system 26 to an analog-to-digital converter system 32 to be tested. The analog-to-digital converter system 32 can be set to convert the internal analog input signal 30 at each transition of either an external or internal clock 34. The analog-to-digital converter system 32 converts the internal analog input signal 30 to digital format and transmits a digital output word 36 to a first-in-first-out buffer circuit 38. The digital output word 36 is a number of parallel data bits depending on the resolution of the analog-to-digital converter system 32 being tested. The first-in-first-out buffer circuit 38 captures and stores the digital output word 36. The first-in-first-out buffer circuit 38 is also operable to transmit a digital output word 40 to an analysis system 42. At the input port of the first-in-first-out buffer circuit 38, digital output words 36 are received and stored in response to each clock 22 input. Each received and stored digital output word 36 is shifted in parallel to an adjacent memory location within the first-in-first-out buffer circuit 38 in response to each clock 22 input until the digital output words 36 are sequentially output from the output port of the first-in-first-out buffer circuit 38. Thus, the first digital output word 36 received by the first-in-first-out buffer circuit 38 will be the first digital output word 40 to be received by the analysis system 42 once all the parallel memory locations within the first-in-first-out buffer circuit 38 are full and the analysis system 42 is able to receive and analyze the digital output word 40.

Also connected to the analog-to-digital converter system 32 is an analog-to-digital conversion architecture select circuit 44. The architecture select circuit 44 may receive an end of convert signal 46 from the analog-to-digital converter system 32 signaling that the analog-to-digital converter system 32 has completed an analog-to-digital conversion. If an end of convert signal 46 is received, the architecture select circuit 44 will transmit a load enable signal 48 to the first-in-first-out buffer circuit 38 instructing the first-in-first-out buffer circuit 38 to capture and store the digital output word 36. Alternatively, if an end of convert signal 46 is not supplied, the architecture select circuit 44 can be set to transmit a load enable signal 48 to the first-in-first-out buffer circuit 38 at each transition of an external clock 50.

Connected to the first-in-first-out buffer circuit 38 is a sample ratio select circuit 52. The sample ratio select circuit 52 defines the rate that a digital output word 36 is captured and stored by the first-in-first-out buffer circuit 38 by transmitting a sample ratio control signal 54 to the first-in-first-out buffer circuit 38. The sample ratio select circuit 52 allows a user to set the capture rate of the first-in-first-out buffer circuit 38 to accommodate the rate that the analysis system 42 can receive and analyze digital output words 40. Thus, for an analysis system 42 operating at 25 MHZ, and a digital output word 36 being generated at 50 MHz, the sample ratio select circuit 52 can be set at a 2:1 value to capture every other digital output word 36 from the analog-to-digital converter system 32.

Connected to both the sample ratio select circuit 52 and the first-in-first-out buffer circuit 38 is the programmable divide circuit 18. When the first-in-first-out buffer circuit 38 is full and cannot receive and store additional digital output words 36, an overflow inhibit signal 56 is transmitted from the first-in-first-out buffer circuit 38 to the programmable divide circuit 18. Additionally, if the analysis system 42 cannot receive and process additional digital output words 40, the first-in-first-out buffer circuit 38 will transmit an overflow inhibit signal 56 to the programmable divide circuit 18 in response to receiving an analysis system inhibit signal 58 from the analysis system 42. The programmable divide circuit 18 responds by transmitting an inhibit signal 60 to the sample ratio select circuit 52 and an inhibit signal 62 to the programmable data ramp controller 14. The inhibit signals function to place the first-in-first-out buffer circuit 38 and the internal digital input signal 24 created by the programmable data ramp controller 14 in a holding pattern until the analysis system 42 is able to receive and analyze another digital output word 40. Thus, the analog-to-digital converter test system 10 can be synchronously controlled in response to a slow or inconsistent analysis system 42.

Accordingly, when the first-in-first-out buffer circuit 38 transmits an overflow inhibit signal 56 in response to an analysis system inhibit signal 58, the programmable data ramp controller 14 does not increment the digital voltage value needed to generate the digital voltage ramp. Thus, the internal digital input signal 24 created by the programmable data ramp controller 14 remains at a constant value. While the internal digital input signal 24 remains at this constant value, the first-in-first-out buffer circuit 38 ignores all digital output words 36 generated by the analog-to-digital converter system 32. Therefore, the analysis system 42 receives digital output words 40 corresponding to a perceived continuously incrementing and uninterrupted digital voltage ramp generated by the programmable data ramp controller 14. Thus, there is no loss of analysis data corresponding to an incrementing internal digital input signal 24 since the analysis system 42 does not receive digital output words 40 that correspond to a period when the internal digital input signal 24 was held at a constant value.

An alternative embodiment of the present invention provides for an external analog input system 64 for dynamic testing of the analog-to-digital converter system 32. The external analog input system 64 transmits an external analog input signal 66 to the analog-to-digital converter system 32. The analog-to-digital converter system 32 converts the external analog input signal 66 to digital format and transmits a digital output word 36 to the first-in-first-out buffer circuit 38. The first-in-first-out buffer circuit 38 then transmits a digital output word 40 to an analysis system 42.

Thus, according to the embodiment described above, the analog-to-digital test system 10 provides the flexibility of using an alternate external analog input signal 66 to test an analog-to-digital converter system 32.

In another alternative embodiment of the invention, an external digital input system 68 is provided. The external digital input system 68 comprises a digital data word generator 70 and is driven by a clock 72. External digital input system 68 transmits an external digital input signal 74 to the digital-to-analog converter system 26. The digital-to-analog converter system 26 converts the external digital input signal 74 to an analog output voltage having a magnitude that is a function of the digital input and transmits an internal analog input signal 30 to the analog-to-digital converter system 32. The analog-to-digital converter system 32 converts the internal analog input signal 30 to digital format and transmits a digital output word 36 to the first-in-first-out buffer circuit 38. The first-in-first-out buffer circuit 38 then transmits a digital output word 40 to an analysis system 42.

Also connected to the data word generator 70 is the programmable divide circuit 18. As discussed above, in response to an overflow inhibit signal 56 from the first-in-first-out buffer circuit 38, the programmable divide circuit 18 transmits an inhibit signal 76 to the data word generator 70 and an inhibit signal 60 to the sample ratio select circuit 52. The inhibit signals function to place the first-in-first-out buffer circuit 38 and the external digital input signal 74 created by the external digital input system 68 in a holding pattern until the analysis system 42 is able to receive and analyze another digital output word 40. Thus, the analog-to-digital converter test system 10 can use an external digital input system 68 synchronously controlled in response to a slow or inconsistent analysis system 42.

Accordingly, the system and method of the present invention provide for a combination of flexible analog-to-digital testing methods with little external support hardware. The present invention provides for flexibility in testing an analog-to-digital converter system 32 by providing three optional testing input sources: (1) an external analog input signal 66 created by an external analog input system 64; (2) an external digital input signal 72 created by an external digital input system 68; or (3) an internal digital input signal 24.

Additionally, the system and method of the present invention provide for using a high resolution internal digital input signal 24 to test the analog-to-digital converter system 32. Precise digital voltage ramps can be created by using an address range control circuit 12 to control the start and stop voltage values of a digital voltage ramp. A programmable divide circuit 18 is used to control the frequency at which the digital voltage ramp increments from the start voltage to the stop voltage. Thus, the programmable data ramp controller 14 generates a high resolution internal digital input signal 24 from a voltage- and frequency-controlled digital voltage ramp.

Also, the system and method of the present invention provide for responding to a slow or inconsistent analysis system 42 by controlling the digital input signal received by a digital-to-analog converter system 26 and the first-in-first-out buffer circuit 38. The digital input signals received by the digital-to-analog converter system 26 can be controlled to remain at a constant digital voltage value, and the first-in-first-out buffer circuit 38 can be controlled to ignore all digital output words 36 created by the analog-to-digital converter system 32 while the digital input signals are at this constant digital voltage value, until the analysis system 42 is able to receive and analyze additional data. Thus, there is no loss of analysis data corresponding to an incrementing digital input signal since the analysis system 42 does not receive digital output words 40 that correspond to a period when the digital input signal is held at a constant digital voltage value.

Although the present invention has been described in detail, it should be understood that various modifications, changes and alterations and substitutions may be made to the teachings disclosed herein without departing from the spirit and scope of the present invention which is solely defined by the appended claims.

What is claimed is:

1. An analog-to-digital test system comprising:
   inputs operable to receive an analog-to-digital converter to be tested;
   an internal analog signal generator operable to generate an internal analog signal that may be used to test an analog-to-digital converter, the internal analog signal generator comprising:
      a digital-to-analog converter operable to generate the internal analog signal;
      an internal digital signal generator coupled to the digital-to-analog converter; and
      an input operable to receive an external digital signal for conversion by the digital-to-analog converter;
   an input operable to receive an external analog signal that may be used directly to test an analog-to-digital converter;
   a buffer to receive and store digital words from an analog-to-digital converter being tested; and
   an output for transmitting digital words from the buffer to an analysis system.

2. The system of claim 1 further comprising:
   a sample ratio controller coupled to the buffer operable to define the rate the buffer receives and stores digital words from an analog-to-digital converter being tested; and
   a divide controller coupled to the buffer, the sample ratio controller, and the internal digital signal generator, the divide controller operable to hold an internal digital signal generated by the internal digital signal generator at a constant digital voltage value, the divide controller further operable to inhibit the buffer from receiving and storing digital words from an analog-to-digital converter being tested while the internal digital signal is held at the constant digital voltage value.

3. The system of claim 2, wherein the divide controller is further coupled to an external digital signal generator operable to generate the external digital signal, the divide controller operable to hold the external digital signal at a constant digital voltage value, the divide controller further operable to inhibit the buffer from receiving and storing digital words from an analog-to-digital converter being tested while the external digital signal is held at the constant digital voltage value.

4. The system of claim 1, wherein the internal digital signal generator comprises:
   a data ramp controller operable to generate an internal digital signal;
   an address controller coupled to the data ramp controller operable to designate upper and lower digital voltage values of the internal digital signal; and
   a divide controller coupled to the data ramp controller operable to designate the frequency of the internal digital signal.

5. An analog-to-digital test system comprising:
   inputs operable to receive an analog-to-digital converter to be tested;
   an internal analog signal generator operable to generate an internal analog signal that may be used to test an analog-to-digital converter, the internal analog signal generator comprising:
      a digital-to-analog converter operable to generate the internal analog signal; and
      an internal digital signal generator coupled to the digital-to-analog converter;
   a buffer to receive and store digital words from an analog-to-digital converter being tested;
   a sample ratio controller coupled to the buffer operable to define the rate the buffer receives and stores digital words from an analog-to-digital converter being tested;
   a divide controller coupled to the buffer, the sample ratio controller, and the internal digital signal generator, the divide controller operable to hold an internal digital signal generated by the internal digital signal generator at a constant value, the divide controller further operable to inhibit the buffer from receiving and storing digital words from an analog-to-digital converter being tested while the internal digital signal is held at the constant value; and
   an output for transmitting digital words from the buffer to an analysis system.

6. The system of claim 5, wherein the internal analog signal generator further comprises an input operable to receive an external digital signal for conversion by the digital-to-analog converter.

7. The system of claim 6, wherein the internal digital signal generator comprises:
   a data ramp controller operable to generate an internal digital signal;
   an address controller coupled to the data ramp controller operable to designate upper and lower digital voltage values of the internal digital signal; and
   wherein the divide controller is further coupled to the data ramp controller and operable to designate the frequency of the internal digital signal.

8. The system of claim 5, further comprising an input operable to receive an external analog signal that may be used directly to test an analog-to-digital converter.

9. An analog-to-digital test system comprising:

inputs operable to receive an analog-to-digital converter to be tested;

an internal analog signal generator operable to generate an internal analog signal that may be used to test an analog-to-digital converter, the internal analog signal generator comprising:
- a digital-to-analog converter operable to generate the internal analog signal;
- a data ramp controller coupled to the digital-to-analog converter operable to generate an internal digital signal;
- an address controller coupled to the data ramp controller operable to designate upper and lower digital voltage values of the internal digital signal; and
- a divide controller coupled to the data ramp controller operable to designate the frequency of the internal digital signal;
- a buffer to receive and store digital words from an analog-to-digital converter being tested; and
- an output for transmitting digital words from the buffer to an analysis system.

10. The system of claim 9, further comprising an input operable to receive an external analog signal that may be used directly to test an analog-to-digital converter.

11. The system of claim 9, further comprising:

a sample ratio controller coupled to the buffer operable to define the rate the buffer receives and stores digital words from an analog-to-digital converter being tested; and wherein the divide controller is further coupled to the buffer and the sample ratio controller, the divide controller operable to hold an internal digital signal generated by the internal digital signal generator at a constant value, the divide controller further operable to inhibit the buffer from receiving and storing digital words from an analog-to-digital converter being tested while the internal digital signal is held at the constant value.

12. The system of claim 11, further comprising an input operable to receive an external analog signal that may be used directly to test an analog-to-digital converter.

13. The system of claim 9, wherein the internal analog signal generator further comprises an input operable to receive an external digital signal for conversion by the digital-to-analog converter.

14. A method to test an analog-to-digital converter comprising the steps of:

providing inputs operable to receive an analog-to-digital converter to be tested;

providing an internal analog signal generator operable to generate an internal analog signal that may be used to test an analog-to-digital converter, the step of providing the internal analog signal generator comprising the steps of:
- providing a digital-to-analog converter operable to generate the internal analog signal;
- providing an internal digital signal generator coupled to the digital-to-analog converter; and
- providing an input operable to receive an external digital signal for conversion by the digital-to-analog converter;
- providing an input operable to receive an external analog signal that may be used directly to test an analog-to-digital converter;
- providing a buffer to receive and store digital words from an analog-to-digital converter being tested; and
- providing an output for transmitting digital words from the buffer to an analysis system.

* * * * *